US011864399B1

(12) United States Patent
Leijtens et al.

(10) Patent No.: US 11,864,399 B1
(45) Date of Patent: Jan. 2, 2024

(54) COMPOSITE MATERIALS FOR TRANSPORT LAYERS IN PEROVSKITE SOLAR CELLS (71) Applicant: Swift Solar Inc., San Carlos, CA (US)

(72) Inventors: Tomas Leijtens, Redwood City, CA (US); Giles Eperon, Arvada, CO (US); Rohit Prasanna, San Francisco, CA (US); Annikki Santala, Woodside, CA (US)

(73) Assignee: Swift Solar Inc., San Carlos, CA (US)

( * ) Notice: Subject to any disclaimer, the term of this patent is extended or adjusted under 35 U.S.C. 154(b) by 0 days.

(21) Appl. No.: 17/821,246

(22) Filed: Aug. 22, 2022

(51) Int. Cl.
*H10K 30/10* (2023.01)
*H10K 85/20* (2023.01)
*H10K 102/00* (2023.01)

(52) U.S. Cl.
CPC .......... *H10K 30/10* (2023.02); *H10K 85/211* (2023.02); *H10K 2102/00* (2023.02)

(58) Field of Classification Search
CPC .................... H10K 30/10; H01L 51/4213
See application file for complete search history.

(56) References Cited

FOREIGN PATENT DOCUMENTS

| CN | 113871556 A | * | 12/2021 | | |
|---|---|---|---|---|---|
| WO | WO-2015085441 A1 | * | 6/2015 | ............... | C09D 7/61 |

OTHER PUBLICATIONS

Gao ("C60:LiF Blocking Layer for Environmentally Stable Bulk Heterojunction Solar Cells") Adv. Mater. 2010, 22, 5404-5408 (Year: 2010).*
Savagatrup ("Mechanical degradation and stability of organic solar cells: Molecular and microstructural determinants") Energy Environ. Sci., 2015,8, 55-80 (Year: 2015).*
LI ("Perovskite Tandem Solar Cells: From Fundamentals to Commercial Deployment") Chem. Rev. 2020, 120, 9835-9950 (Year: 2020).*
JAYAN ("Simulation and optimization studies on CsPbI3 based inorganic perovskite solar cells") Solar Energy 221 (2021) 99-108 ( Year: 2021).*
English machine translation of CN 113871556 A (Year: 2023).*
Menzel ("Field Effect Passivation in Perovskite Solar Cells by a LiF Interlayer"), Adv. Energy Mater. 2022, 12, 2201109 (Year: 2022).*
The impact of energy alignment and interfacial recombination on the internal and external open-circuit voltage of perovskite solar cells, from the journal: Energy & Environmental Science, Issue 9, 2019, 7 pages.
C60:LIF Blocking Layer for Environmentally Stable Bulk Heterojunction Solar Cells, by Dong Gao et al., Advanced Materials, vol. 22, Issue 47, p. 5404-5408, Oct. 26, 2010.

* cited by examiner

Primary Examiner — Angelo Trivisonno
(74) Attorney, Agent, or Firm — Aikin & Gallant, LLP (57) ABSTRACT

Solar cell stack-ups are described in which fullerene based transport layers are blended with a metal halide such as LiF, CsF or MgF$_2$. In particular, perovskite solar cell stack-ups are described in which an electron transport layer includes a metal halide and fullerene blend.

17 Claims, 6 Drawing Sheets

COMPOSITE MATERIALS FOR TRANSPORT LAYERS IN PEROVSKITE SOLAR CELLS

BACKGROUND

Field

Embodiments described herein relate to solar cells, and more particularly to transport layers thereof.

Background Information

Photovoltaic cells, also referred to solar cells, are devices that convert radiant photo energy into electrical energy. While monocrystalline solar cells are dominant in the current solar cell industry and offer some of the highest efficiencies and lifetimes, thin-film solar cells are gaining more attention due to the potential to implement economical in-line processes of deposition and patterning. Furthermore, some thin-film solar cells can be flexible with potential applications on curved surfaces, mobile devices, or other components. One such emerging thin-film technology is perovskite solar cells. Existing electron transport layers used in perovskite solar cells are commonly composed of a single bulk material, often either $TiO_2$, $SnO_x$, or organic material such as C60 fullerene. The fullerene material in particular is a commonly used transport layer material when making perovskite solar cells for integration into tandem architectures.

SUMMARY

Solar cell stack-ups, and in particular perovskite solar cell stack-ups are described in which a transport layer, and in particular a fullerene based transport layer is blended with a metal halide such as LiF, CsF or $MgF_2$. Such a composition has been observed to provide a foundation for subsequent growth of a durable buffer layer, and to provide improved mechanical properties such as resistance to bending.

DETAILED DESCRIPTION

Embodiments describe solar cell stack-ups, and in particular perovskite solar cell stack-ups including blended transport layers.

In one aspect, it has been observed that common fullerene materials used for tandem solar cell architectures or other solar cells for flexible solar cell applications are mechanically weak and do not form a good surface for nucleating subsequent layers when processed by chemical vapor deposition (CVD), inclusive of atomic layer deposition (ALD). The mechanical weakness of the fullerene layer can cause delamination upon packaging. The nucleation attribute in turn can affect the quality of subsequent layers. For example in an exemplary hole transport layer (HTL)—perovskite—ETL architecture, an additional CVD metal oxide layer can be deposited over the fullerene ETL as a buffer layer that protects the underlying layers from sputter deposition during deposition of a subsequent front transparent electrode layer and/or as a diffusion barrier layer for a metal electrode layer. A fullerene material has also been observed to add parasitic absorption to the ETL reducing the efficiency of tandem solar cells where the light enters through the front.

In accordance with embodiment, perovskite solar cell stack-ups are described in which transport layers (e.g. ETL, HTL) include a metal halide (e.g. lithium fluoride (LiF), cesium fluoride (CsF), magnesium fluoride ($MgF_2$)) blended with a fullerene material. For example, the metal halides can be evaporated simultaneously with fullerene at 20% or more material loading (by volume). Metal halides such as LiF are hygroscopic and polar, and may adhere well to adjacent layers and help nucleate a subsequent CVD process for buffer layer deposition. The resultant composite transport layer may exhibit improved mechanical strength while maintaining necessary electrical properties.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers.

Figure 1A:
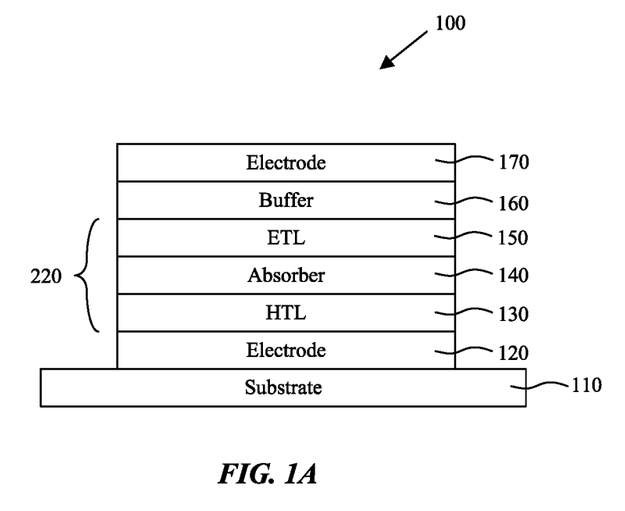
FIG. 1A is an illustrative diagram of solar cell stack-up in accordance with an embodiment.
Figure 1B:
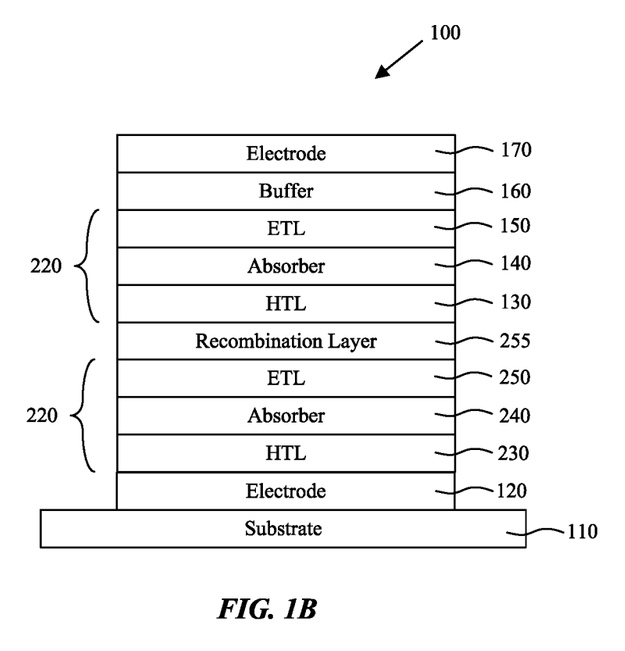
FIG. 1B is an illustrative diagram of a tandem solar cell stack-up in accordance with an embodiment.

Referring now to FIGS. 1A-1B, FIG. 1A is an illustrative diagram of solar cell stack-up in accordance with an embodiment, and FIG. 1B is an illustrative diagram of tandem solar cell stack-up in accordance with an embodiment. In the following description various layers and compositions are described for the solar cell stack-ups. It is to be appreciated that each layer may include a single layer, or multiple layers. Furthermore, reference to bottom or top layers herein is relative and may not be reflective of actual orientation in product.

In the particular embodiments illustrated in FIGS. 1A-1B, the solar cells 100 may absorb light from the bottom side of the illustrated stack-ups, for example through a transparent substrate 110. The transparent substrate 110 may be rigid or flexible. For example, the transparent substrate 110 can include a permanent or temporary carrier such as glass and top (flexible) polymer adhesion layer.

As illustrated, the solar cell 100 may include a bottom electrode layer 120 formed on the substrate 110, a top electrode layer 170, and a subcell 220 between the bottom and top electrode layers. Additionally, a buffer layer 160 may be formed on the subcell 220 (e.g. by CVD or ALD). The buffer layer 160 may additionally function as a charge transport layer. In the particular embodiment illustrated, the buffer layer 160 can function as both a barrier layer and charge transport layer. The subcell 220 includes an absorber layer 140 and one or more transport layers. In the embodiment illustrated, the subcell 220 includes a hole transport layer (HTL) 130 over the bottom electrode layer 120, an absorber layer 140 over the HTL 130, and an electron transport layer (ETL) 150 over the absorber layer 140. The buffer layer 160 may also function as an ETL in this configuration, and physically separate the top electrode layer 170 from the subcell 220, and specifically from the absorber layer 140.

In a specific embodiment, bottom electrode layer 120 is formed of a transparent material. Exemplary transparent bottom electrode materials include poly(3,4-ethylenedioxythiophene) polystyrene sulfonate (PEDOT:PSS), transparent conductive oxides (TCOs) such as indium tin oxide (ITO), fluorine doped tin oxide (FTO), indium zinc oxide (IZO), aluminum doped zinc oxide (AZO), cadmium stannate, etc. The HTL 130 may include one or more layers formed of a metal oxide such as nickel oxide (NiOx) or vanadium oxide ($V_2O_5$), an organic polymer such as poly(triaryl amine) (PTAA) or small molecules such as 2,2',7,7'-Tetrakis[N,N-di(4-methoxyphenyl)amino]-9,9'-spirobifluorene (spiro-MeOTAD). The HTL 130 may additionally be doped with to increase conductivity, and may include a bi-layer of a metal oxide (e.g. NiOx) and an organic layer such as PTAA on top.

The absorber layer 140 in accordance with embodiments may be formed of a perovskite material. Perovskite materials may be characterized by the formula $ABX_3$, with A representing a large atomic or molecular cation (e.g. Cs, methylammonium, formamidinium, etc.), with B representing a positively charged cation (e.g. metal, lead, plumbate, Sn), and X representing a negatively charged anion (e.g. halide, I, Br, Cl). Perovskite materials can also include a mixture of 2D and 3D structures in the family of $A^1{}_mA_nB_{n-1}X_{3n-1}$ where $A^1$ represents a positively charged cation (eg butylammonium, phenethylammonium, guanidinium, etc.) Alternative materials such as organic materials can calo be used as the absorber layer.

ETL 150 in accordance with embodiments can be formed of a fullerene blended with a metal halide (e.g. lithium fluoride (LiF), cesium fluoride (CsF), magnesium fluoride ($MgF_2$)). For example, the metal halides can be evaporated simultaneously with fullerene at 20% or more material loading (by volume percent). Metal halides such as LiF are hygroscopic and polar, and may adhere well to adjacent layers and help nucleate a subsequent CVD process for buffer layer deposition. The buffer layer 160 in accordance with embodiments may be formed of an n-type metal oxide such as tin oxide or aluminum zinc oxide (AZO) over the fullerene layer. In an embodiment, the top electrode layer 170 includes one or more metal layers, such as Ag, Cr, Au, Cu, Al, etc.

FIG. 1B is an illustrative diagram of a tandem solar cell stack-up in accordance with embodiments. The tandem structure may include multiple absorber layers, which may be the same or different materials. In the specific embodiment described the tandem structure is a perovskite-perovskite tandem structure, though embodiments are not so limited. Electrode layer 120, HTL 130, absorber layer 140, and ETL 150 may be similar as described with regard to FIG. 1A. Similarly, HTL 230 may be similar to HTL 130, absorber layer 240 similar to absorber layer 140, and ETL 250 similar to ETL 150. Notably, while absorber layers 140, 240 may be formed of similar perovskite-based materials, they may be tuned for different bandgaps. One or more of the absorber layers may also be formed of an organic material. A recombination layer 255 may be located between the stacked subcells 220, between ETL 250 and HTL 130. Recombination layer 255 may be a transparent conducting layer such as a TCO, or ITO specifically. Buffer layer 160 and top electrode layer 170 may additionally be formed similarly as with regard to FIG. 1A.

Figure 1C:
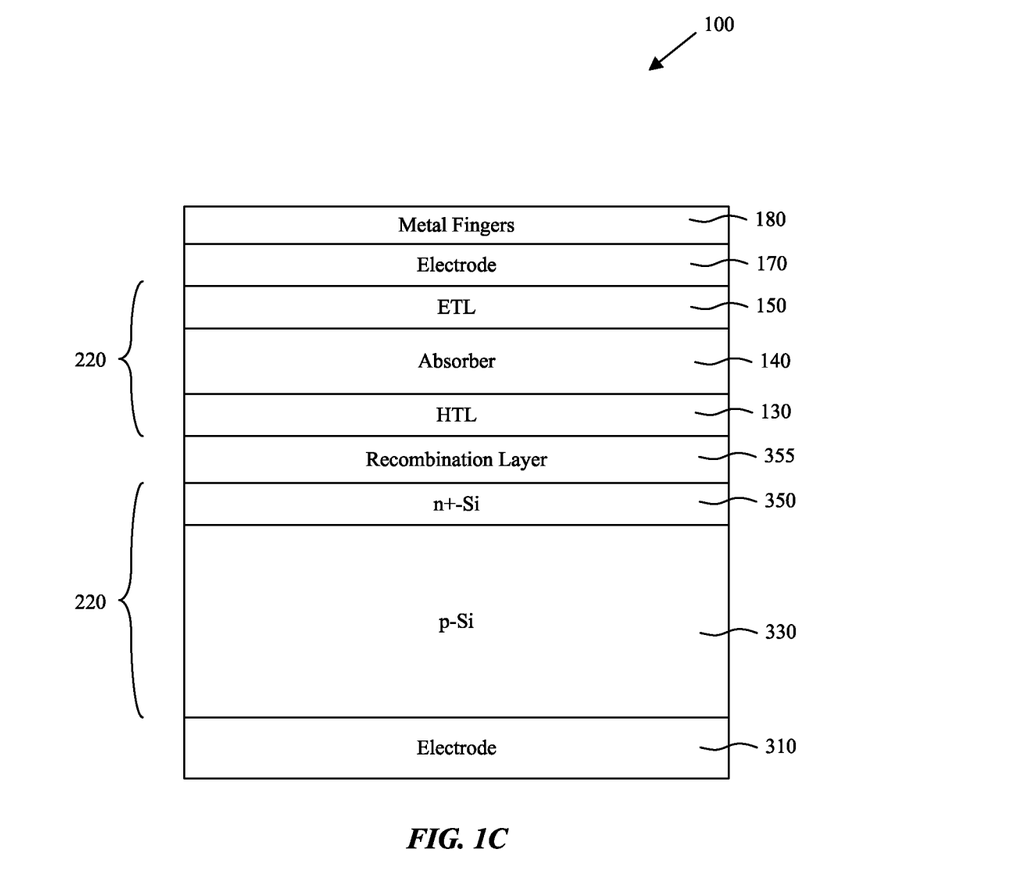
FIG. 1C is an illustrative diagram of a silicon-perovskite tandem solar cell stack-up in accordance with an embodiment.

FIG. 1C is an illustrative diagram of an alternative tandem solar cell stack-up in accordance with embodiments. In particular, FIG. 1C illustrates a silicon-perovskite tandem solar cell stack-up in accordance with embodiments. Additionally, the silicon-perovskite tandem solar cell stack-up may absorb light from the top side rather than bottom side. The tandem structure may include an HTL 130, absorber layer 140, and ETL 150 similarly as described with regard to FIG. 1A. Such a top perovskite cell may be formed on a lower silicon subcell 220 including a p-doped silicon layer 330 and n-doped silicon layer 350. A recombination layer 355 can be located between the subcells 220. The recombination layer 355 may be formed of a transparent material similar to recombination layer 255. Since the silicon part may be opaque, the top electrode layer 170 may be formed of a transparent conducting layer such as poly(3,4-ethylenedioxythiophene) polystyrene sulfonate (PEDOT:PSS), transparent conductive oxides (TCOs) such as indium tin oxide (ITO), fluorine doped tin oxide (FTO), indium zinc oxide (IZO), aluminum doped zinc oxide (AZO), cadmium stannate, etc. A top metal pattern 180 may then be formed over the transparent top electrode layer 170, for example to facilitate charge transport. In an embodiment, the top metal pattern is formed of a suitable material such as Ag, Cr, Au, Cu, Al, etc. The top metal pattern 180 may be formed in the shape of finger electrodes so as to transport charge without overly blocking light transmission. A back side contact 310 may also be formed underneath the p-doped silicon layer 330. Back side contact 310 may be formed of a suitable material such as Ag, Cr, Au, Cu, Al, etc.

In each of the previous embodiments described with regard to FIGS. 1A-1C specific stack-ups are described and illustrated with a p-i-n or p-n orientation, though the order of electron and hole transport layers may also be flipped in accordance with embodiments. These changes in order of layer formation can additionally change materials selection of some layers without straying from the principles of the embodiments. Thus, reference to ETL or HTL may be reversed in accordance with embodiments.

In order to demonstrate the effectiveness of blending metal halides with fullerene transport layers various test samples were prepared and tested for solvent removal, bend radius to delamination, and current-voltage curve characteristics. In each test, at least control sample was prepared including a LiF:fullerene bi-layer and compared to various LiF:fullerene blends with different LiF loadings.

Control Sample

Figure 2:
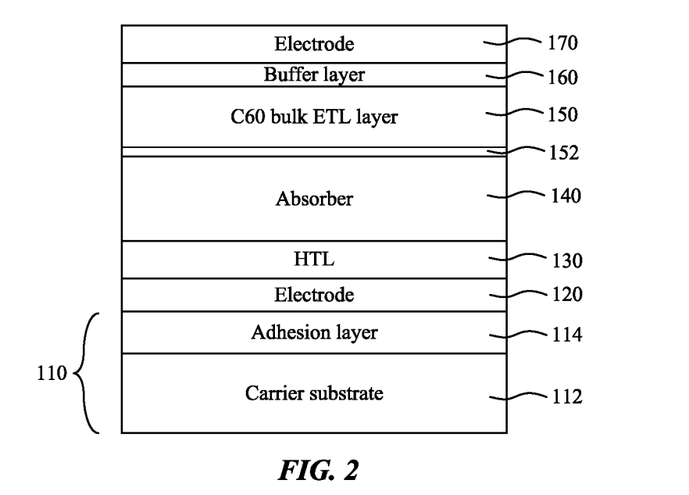
FIG. 2 a schematic cross-sectional side view illustration is provided of a solar cell control sample used for testing in accordance with embodiments.

Referring now to FIG. 2 a schematic cross-sectional side view illustration is provided of a control sample used for testing in accordance with embodiments. As shown, the control sample was formed starting with the formation of a 25 μm thick polyethylene terephthalate (PET) adhesion layer 114 on a glass carrier substrate 112. This is followed by deposition of a 75-200 μm thick ITO bottom electrode layer 120. A bi-layer HTL 130 was then formed including a first 40 nm thick metal oxide layer and top 5-10 nm thick organic layer, or more specifically PTAA. The HTL 130 is then followed by a 400-600 nm thick perovskite absorber layer 140. An ETL 150 can then be formed on the perovskite absorber layer 140.

In the particular control sample illustrated in FIG. 2, an initial 0.5-2 nm thick LiF wetting layer 152 is deposited, followed by a 10-30 nm fullerene bulk ETL 150 and a 15 nm thick metal oxide (SnOx) buffer layer 160. A top electrode layer 170 is then formed over the buffer layer 160. A thin adhesion layer (e.g. 10 nm thick oligomers and polymers) such as a such as a perylene derivative or polymer or polyethylenimine-ethoxylated can optionally be located between the bulk ETL 150 and buffer layer 160.

LiF: Fullerene Blend Samples

Figure 3:
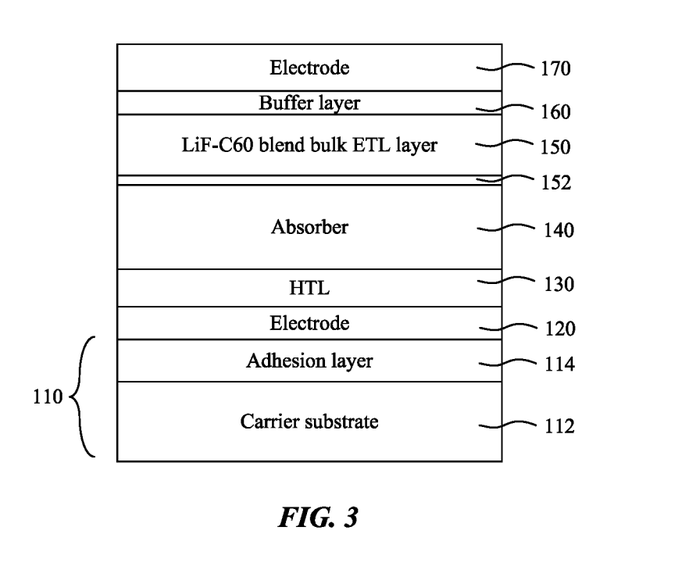
FIG. 3 a schematic cross-sectional side view illustration is provided of a solar cell with blended electron transport layer used for testing in accordance with embodiments.

Referring now to FIG. 3, samples similar to the control sample of FIG. 2 were prepared with modifications to the to ETL 150. As shown, the ETL 150 still includes a 0.5-2 nm thick LiF wetting layer 152, followed by a 10-30 nm thick LiF: fullerene blend bulk ETL 150. In accordance with embodiments, various different LiF loading amounts were blended with fullerene with simultaneous vapor deposition. Depending upon test sample, blend amounts varied between 1%, 5%, 25%, 33%, 67% and 75%. Following deposition of the bulk ETL 150 a 15 nm thick SnOx buffer layer 160 and top electrode layer 170 were deposited. A thin adhesion layer (e.g. 10 nm thick oligomers and polymers) such as a such as a perylene derivative or polymer or polyethylenimine-ethoxylated can optionally be located between the bulk ETL 150 and buffer layer 160.

Solvent Buffer Layer Testing

Figure 4:
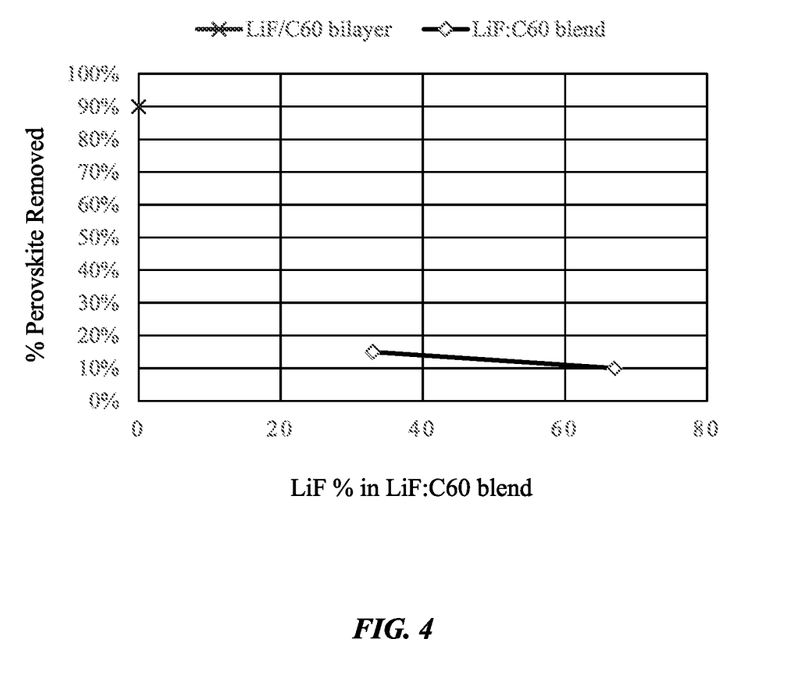
FIG. 4 is a chart illustrating percent perovskite absorber layer removal after solvent buffer layer testing of solar cells with different electron transport layer compositions in accordance with embodiments.

In order to test the barrier quality of buffer layer 160 the control sample, and LiF: fullerene blend samples of 33% LiF and 67% LiF (by volume) were exposed to dimethylformamide (DMF) solvent for a uniform time period, and the samples were then measured for weight % remaining of the underlying perovskite absorber layer. The results presented in FIG. 4 indicate approximately 90% of the original perovskite absorber layer was dissolved with the control sample, whereas approximately 15% of the perovskite absorber layer was dissolved with a 33% LiF: fullerene blend, and approximately 10% of the perovskite absorber layer was dissolved with a 67% LiF: fullerene blend. These results suggest that the quality of the buffer layer 160 grown on top of the HTL bulk layers including LiF: fullerene blends demonstrated substantially improved barrier properties.

Bend Radius Testing

Figure 5:
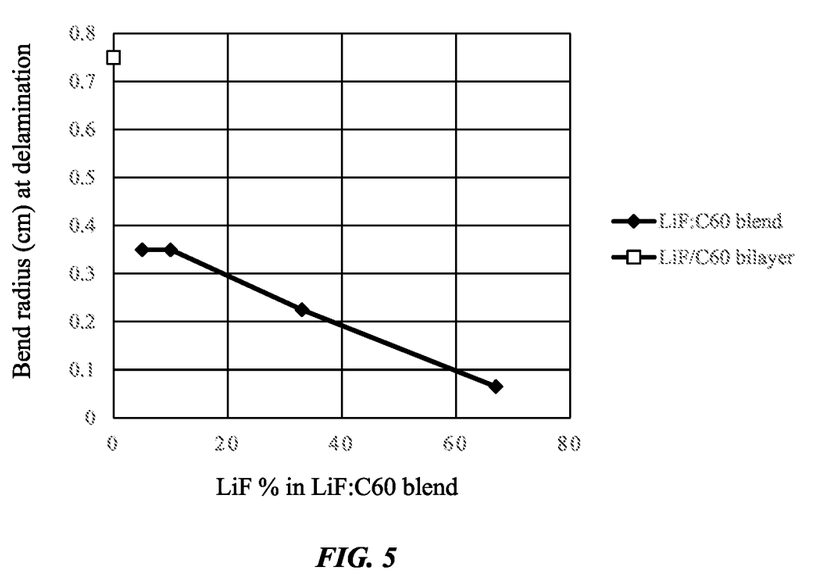
FIG. 5 is a chart illustrating bend radius at delamination for solar cells with different electron transport layer compositions in accordance with embodiments.

It has been observed that a fullerene layer in particular has weak cohesion to both itself and weak adhesion to neighboring layers. This can be a prohibitive attribute for flexible perovskite solar cells, and can result in delamination in flexible packaged solar cells and modules. In order to test the mechanical strength of the LiF blended fullerene layers bend radius testing was performed to measure bend radius until delamination occurred either within the fullerene layer or with an adjacent layer. The results are provided in FIG. 5. As shown, delamination was detected at approximately a 0.75 cm bend radius for the control sample. Bend radius testing was significantly improved for even small additions of LiF, with 0.35 cm bend radius results for 5% and 10% LiF blends, a 0.225 cm result for a 33% LiF blend, and further improvement at a 67% LiF blend with a 0.065 cm bend radius test result. Thus, bend radius tests showed improvement with increased LiF loading. It is expected that the increased improvement was due to both cohesion and adhesion strength gains.

Electrical Testing

In order to validate that the LiF blended fullerene layers retain sufficient electrical characteristics relative to the control sample composition various samples were prepared and tested with current-voltage (i-V) curves, which illustrate both open current voltage (Voc) where the curves cross 0 current value, and series resistance (which corresponds to slope of the curve at far forward bias, i.e. more forward bias than the open circuit voltage). More specifically, a steeper slope corresponds to a lower series resistance and higher fill factor for the solar cells.

Figure 6:
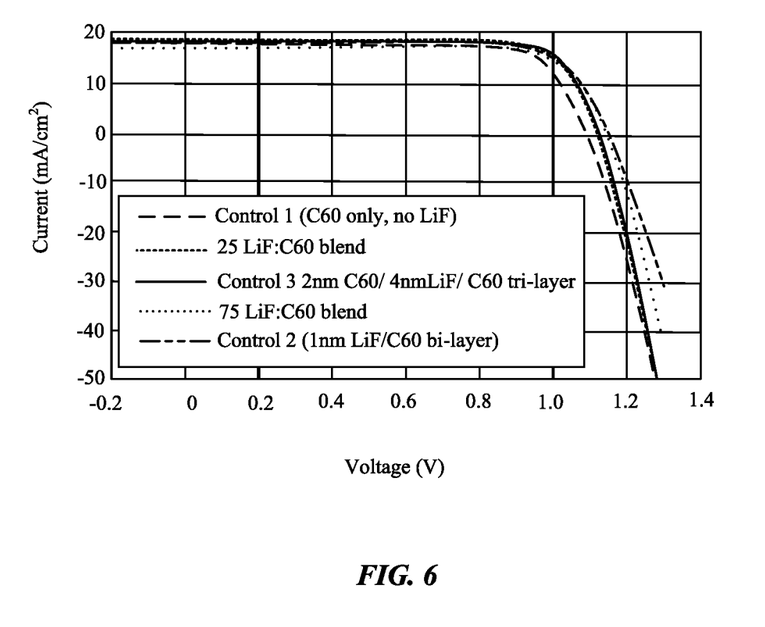
FIG. 6 is a chart illustrating current-voltage electrical testing for solar cells with different electron transport layer compositions in accordance with embodiments.

With reference now to the results provided in FIG. 6, a first control sample (Control 1) is shown in which a LiF wetting layer 152 is omitted. A second control sample (Control 2) is also proved in which a 1 nm thick LiF wetting layer 152 is provided. Each of these samples represents a lower and upper boundary for open current voltage (Voc), respectively. As shown, Voc is improved with the inclusion of LiF wetting layer 152 underneath a fullerene (C60) bulk ETL 150, but the series resistance is increased. A third control sample (Control 3) with a tri-layer wetting layer demonstrated an intermediate Voc result and lower series resistance. Blending of LiF with fullerene in the bulk ETL 150 is shown to include some Voc performance gains compared to Control 1, and an improved slope compared to Control 2, corresponding to reduced series resistance. The cells with the LiF blended into the ETL exhibited lower series resistance than Control Samples 1-2 with the 25% LiF blend exhibiting lower series resistance than the 75% LiF blend. This suggests the blended approach allows for the improved open circuit voltage associated with inserting a LiF wetting layer while also reducing the series resistance of the cell, which may be attributed to enhancing conductivity of the fullerene. Furthermore, the improved series resistance suggests a multi-layer wetting layer, such as with Control 3, can be omitted.

While the above test samples have been specifically directed to blending of LiF with fullerenes, embodiments are not limited to LiF and may include other metal halides. For example, when LiF is substituted by CsF or $MgF_2$ similar effects may be observed. Specifically, LiF: fullerene blend samples were prepared as described above and tested for series resistance and open circuit voltage by illuminating the solar cell with a lamp of standard solar spectrum (AM1.5G) and measuring the current-voltage (JV) curve. Specific samples and test results are provided in Table I. Similar samples were also prepared and tested with LiF substituted by CsF. Specific samples and test results are provided in Table II. Additional samples with slightly different perovskite composition and LiF substituted by $MgF_2$ were additionally prepared and tested. Specific samples and test results are provided in Table III below.

TABLE I

|  | Series resistance (ohms cm$^2$) | Open circuit voltage (V) |
| --- | --- | --- |
| Control 1 (C60 only, no LiF) | 3.75 | 1.08 |
| Control 2 (1 nm LiF/C60 bi-layer) | 4.76 | 1.15 |
| 25% LiF:C60 blend | 3.00 | 1.12 |
| 75% LiF:C60 blend | 3.00 | 1.15 |

TABLE II

|  | Open circuit voltage (V) | Efficiency (%) |
| --- | --- | --- |
| Control 2 (1 nm LiF/C60 bi-layer) | 1.12 | 17 |
| 33% CsF:C60 blend | 1.1 | 14.2 |
| 67% CsF:C60 blend | 1.125 | 14.2 |
| 1 nm LiF/67% CsF:C60 blend bi-layer | 1.125 | 15 |

TABLE III

|  | Open circuit voltage (V) | Efficiency (%) |
| --- | --- | --- |
| 2 nm C60/33% LiF:C60 blend bi-layer | 1.09 | 13.4 |
| 1 nm C60/33% MgF$_2$:C60 blend bi-layer | 1.07 | 12.7 |
| 0.75 nm MgF$_2$/C60 bi-layer | 1.08 | 13.8 |
| 33% MgF$_2$:C60 blend | 1.08 | 12.6 |

As shown in Tables I and II, blending CsF into fullerene also enhances open circuit voltage in architectures without a LiF wetting layer, similar to the behavior observed when LiF is blended into the ETL layer. A similarly high concentration of CsF can be used to achieve efficient devices, somewhat unexpectedly that device performance can be maintained at such high loading of insulators such as CsF and LiF. Another trial with cesium carbonate (CsCO$_3$) was also performed without yielding a functional device. This suggests that that the alkali metal halides have unique properties that allow their inclusion into the ETL layer at very high concentrations, either improving or not significantly deteriorating device performance, while also enhancing mechanical properties as well as the suitability for CVD (including ALD) layer growth. The results of Table III additionally support that functional devices can also be achieved with the alkaline earth metal halide MgF$_2$.

In an embodiment a solar cell includes a first electrode layer, an absorber layer, and a transport layer between the first electrode layer and the absorber layer. The transport layer may be a HTL or ETL, and include a metal halide and fullerene blend. In an embodiment the metal halide is blended throughout an entire thickness of the transport layer, and may be uniformly blended throughout the entire thickness. In an embodiment, the transport layer is at least 5 nm thick, or more specifically at least 10 nm thick. In an embodiment, the metal halide is at least 20% by volume of the second transport layer such as 20%-75%.

Referring to the exemplary embodiments illustrated in FIGS. 1A-3, in an embodiment the transport layer is a first electron transport layer (ETL) 150. In accordance with embodiments the metal halide may comprise materials such as LiF, CsF, MgF$_2$, etc. For example, the metal halide may be fluorine (F) containing or lithium (Li) containing. Metal halide blending can also be used in the HTL 130. In an embodiment, the first HTL 130 includes a metal oxide layer. In an embodiment, the HTL 130 additionally includes an organic layer over the metal oxide layer.

One or more wetting layers 152 can optionally be located between the absorber layer 140 and the transport layer (e.g. ETL 150). In an embodiment the wetting layer 152 comprises a LiF layer. For example, the one or more wetting layers 152 can include metal halide (e.g. LiF) layer(s), fullerene layer(s), and multiple layers of various metal halide and fullerene layers. For example, the wetting layer can include a C60/LiF/C60 tri-layer, a LiF/C60 bi-layer, etc.

In accordance with embodiments, a buffer layer 160 can be located between the transport layer (e.g. ETL 150) and the first electrode layer 170. In an embodiment, the buffer layer 160 includes a metal oxide, such as SnOx which may optionally be doped with aluminum. An adhesion layer can optionally be located between the buffer layer 160 and the transport layer (e.g. ETL 150).

The solar cells in accordance with embodiments can be single cells, or multiple cell stacks including tandem cells. In an exemplary p-i-n arrangement, the solar cell includes a transparent electrode layer 120 underneath the absorber layer 140. In such a stack-up the first (top) electrode layer 170 can include one or more metal layers. It is to be appreciated that embodiments are not limited to p-i-n arrangements, and can include n-i-p arrangements.

Tandem structures are also described. In an embodiment, the solar cell includes tandem (e.g. perovskite) subcells. For example, a first ETL 150 and first HTL 130 can be part of a first subcell 220 stacked on top of a second subcell 220 including a second HTL 230, second ETL 250 over the second HTL and a second perovskite absorber layer 240 between the second HTL 230 and the second ETL 250. In an embodiment, the solar cell includes tandem silicon-perovskite subcells. For example, a first ETL 150 and first HTL 130 can be part of a first subcell 220 stacked on top of a second subcell 220 including a p-doped silicon layer and an n-doped silicon layer.

In utilizing the various aspects of the embodiments, it would become apparent to one skilled in the art that combinations or variations of the above embodiments are possible for forming perovskite solar cell stack-up including a blended transport layer. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A solar cell comprising:
   a bottom electrode;
   a bottom transport layer over the bottom electrode;
   a perovskite absorber layer over the bottom transport layer;
   a top transport layer over the perovskite absorber layer, wherein the top transport layer includes a metal halide and fullerene blend, and the metal halide comprises 20%-67% by volume of the top transport layer;
   a buffer layer over the top transport layer; and
   a top electrode layer over the buffer layer.

2. The solar cell of claim 1, wherein the metal halide is blended throughout an entire thickness of the top transport layer.

3. The solar cell of claim 2, wherein the top transport layer is at least 5 nm thick.

4. The solar cell of claim 2, wherein the metal halide is uniformly blended throughout the entire thickness of the top transport layer.

5. The solar cell of claim 1, wherein the top transport layer is a first electron transport layer (ETL).

6. The solar cell of claim 5, wherein the metal halide comprises Li.

7. The solar cell of claim 5, wherein the metal halide comprises F.

8. The solar cell of claim 5, further comprising a wetting layer between the perovskite absorber layer and the top transport layer.

9. The solar cell of claim 8, wherein the wetting layer comprises LiF or fullerene.

10. The solar cell of claim 5, wherein the buffer layer comprises a metal oxide.

11. The solar cell of claim 10, wherein the metal oxide is doped with aluminum.

12. The solar cell of claim 10, further comprising an adhesion layer between the buffer layer and the ETL.

13. The solar cell of claim 10, wherein the bottom transport layer is a first hole transport layer (HTL), the bottom electrode is a transparent electrode layer underneath the perovskite absorber layer, and the top electrode layer includes a metal layer.

14. The solar cell of claim 10, wherein the bottom transport layer is a first hole transport layer (HTL), and the first ETL and the first HTL are part of a first subcell stacked on top of a second subcell, the second subcell comprising:
a second HTL;
a second ETL over the second HTL; and
a second perovskite absorber layer between the second HTL and the second ETL.

15. The solar cell of claim 10, wherein the bottom transport layer is a first hole transport layer (HTL), and the first ETL and the first HTL are part of a first subcell stacked on top of a second subcell, the second subcell comprising:
p-doped silicon layer; and
an n-doped silicon layer.

16. The solar cell of claim 10, wherein the bottom transport layer is a first hole transport layer (HTL), and the first HTL comprises a metal oxide layer.

17. The solar cell of claim 16, wherein the first HTL comprises an organic layer over the metal oxide layer.

* * * * *